(12) United States Patent
Wieczorek et al.

(10) Patent No.: US 6,673,665 B2
(45) Date of Patent: Jan. 6, 2004

(54) SEMICONDUCTOR DEVICE HAVING INCREASED METAL SILICIDE PORTIONS AND METHOD OF FORMING THE SEMICONDUCTOR

(75) Inventors: Karsten Wieczorek, Dresden (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/210,637

(22) Filed: Jul. 31, 2002

(65) Prior Publication Data

US 2003/0162349 A1 Aug. 28, 2003

(30) Foreign Application Priority Data

Feb. 28, 2002 (DE) .......................... 102 08 751

(51) Int. Cl.[7] .......................................... H01L 21/8234
(52) U.S. Cl. .................. 438/233; 438/592; 438/655
(58) Field of Search .................... 438/233, 586, 438/592, 595, 655, 656, 657

(56) References Cited

U.S. PATENT DOCUMENTS

| | | | | |
|---|---|---|---|---|
| 5,672,544 A | * | 9/1997 | Pan | 438/305 |
| 5,726,479 A | * | 3/1998 | Matsumoto et al. | 257/412 |
| 5,851,890 A | | 12/1998 | Tsai et al. | 438/303 |
| 5,889,331 A | * | 3/1999 | Bai | 257/768 |
| 5,920,783 A | | 7/1999 | Tseng et al. | 438/305 |
| 6,046,105 A | | 4/2000 | Kittl et al. | 438/655 |
| 6,140,192 A | * | 10/2000 | Huang et al. | 438/595 |
| 6,461,951 B1 | * | 10/2002 | Besser et al. | 438/592 |

FOREIGN PATENT DOCUMENTS

WO    WO 01/88991 A2    11/2001    .......... H01L/29/00

\* cited by examiner

*Primary Examiner*—Chandra Chaudhari
(74) *Attorney, Agent, or Firm*—Williams, Morgan & Amerson, P.C.

(57) ABSTRACT

The surface area of silicon lines which receives a silicide portion is increased to decrease the line resistance in narrow polysilicon lines, such as gate electrodes. Sidewall spacers are formed such that an upper portion of the line sidewall is exposed so as to react with a refractory metal to form a low resistance silicide. The upper portion may be exposed by overetching the dielectric layer deposited to form the sidewall spacers.

24 Claims, 7 Drawing Sheets

SEMICONDUCTOR DEVICE HAVING INCREASED METAL SILICIDE PORTIONS AND METHOD OF FORMING THE SEMICONDUCTOR

BACKGROUND OF THE INVENTION

1. Field of the Invention

The present invention relates to the field of fabrication of integrated circuits, and, more particularly, to a semiconductor device having metal silicide portions formed therein and a method of forming metal silicide portions on silicon-containing regions.

2. Description of the Related Art

Field effect transistors represent the most frequently used circuit elements in modern integrated circuits. Typically, a huge number of field effect transistors is simultaneously formed on an appropriate substrate and are connected to establish the required functionality of the circuit. In presently available integrated circuits, silicon is the primarily used semiconductor material and forms an essential part of a field effect transistor. Generally, a silicon-based field effect transistor comprises two highly doped silicon regions, also referred to as drain and source regions, that are embedded in a lightly and inversely doped silicon region, the so-called n-well or p-well, depending on the type of transistor. The drain and the source regions are spaced apart with a channel region interposed, wherein a conductive channel forms between the drain and source regions in the channel region upon application of an appropriate voltage to a gate electrode that is usually formed over the channel region and is separated therefrom by a gate insulation layer, often provided as a gate oxide layer.

Thus, in the most common field effect transistors, the gate structure essentially comprises the gate electrode formed above the gate insulation layer, with polysilicon often being selected as the material for forming the gate electrode for several reasons. For instance, polysilicon exhibits high compatibility with subsequent high temperature processes. Moreover, the polysilicon interface with thermal silicon dioxide ($SiO_2$) is well understood and electrically stable. Furthermore, polysilicon is more reliable than aluminum gate materials and can be deposited conformally over steep topography.

However, problems arise when polysilicon is used as a gate material, due to its higher resistivity compared to aluminum. In fact, the defects in the grain boundaries of the polysilicon, together with the decreased overall free carrier concentration, cause the resistivity of polysilicon lines, such as the gate electrode, to increase.

In particular, even when doped at the highest practical concentration, a $0.5\mu$ thick polysilicon film has a sheet resistance of about 20 $\Omega$/sq (compared to 0.05 $\Omega$/sq for a $0.5\mu$ thick aluminum film). The resulting high values of interconnect line resistance can lead to relatively long RC time constants (i.e., long propagation delays) and severe DC voltage variations within a VLSI (very large scale integration) circuit.

To overcome this drawback, several solutions have been proposed and developed in the art. Among these solutions, the formation of metal silicides on the top of the polysilicon gate structure proved to be the most reliable one for obtaining the lowest resistance values.

A typical prior art method of forming metal silicides on silicon-containing regions, such as the gate electrode, of a CMOS transistor will be described in the following with reference to FIGS. 1a–1d. In FIGS. 1a–1d, reference 1 relates to an arbitrary section of a substrate, for instance a silicon wafer, on which a CMOS transistor 100 is to be formed. In particular, in FIG. 1a, there is depicted the situation at the moment during the manufacturing process when metal silicides are to be formed. Accordingly, in FIG. 1a, reference 2 relates to isolation structures which have been previously formed. These isolation structures 2 divide the section of the substrate 1 into two portions, on which the PMOS transistor and the NMOS transistor are to be formed, respectively. In this particular case, the PMOS portion is depicted on the left side of the figure and the NMOS portion on the right side of the figure.

Moreover, in FIGS. 1a–1d, references 3p and 3n relate to the gate polysilicon electrodes of the PMOS and NMOS transistors, respectively. References 4p and 4n relate to oxide side spacers formed on the sidewalls of the gate polysilicon electrodes. References 6p and 6n relate to the gate insulation layers on the PMOS region and the NMOS region, respectively. Finally, references 5p and 5n relate to the source and drain regions of the PMOS and NMOS transistors, respectively.

Figure 1A:
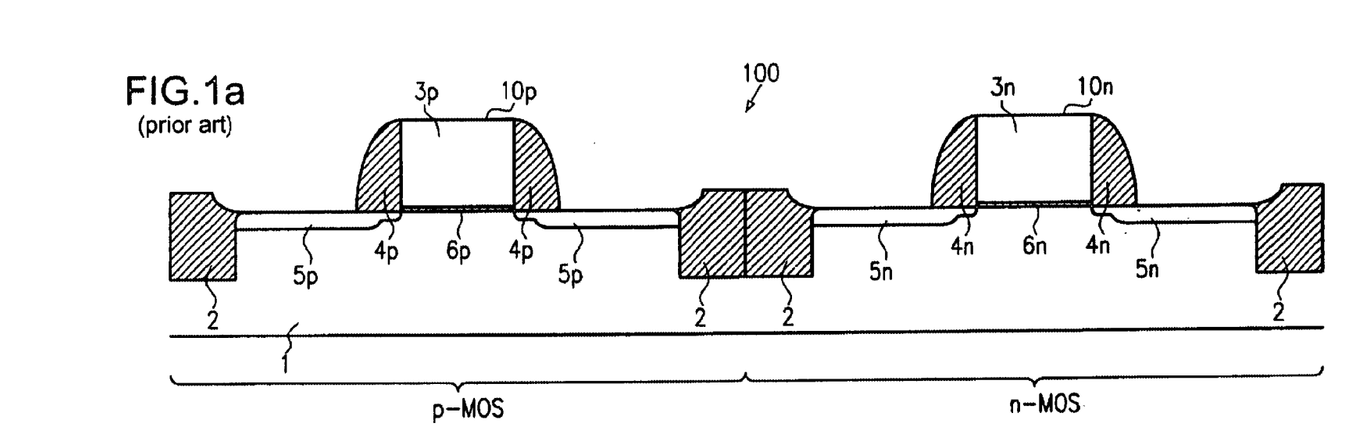
FIGS. 1a–1d represent a typical process sequence of a prior art method of forming metal silicides.
Figure 1B:
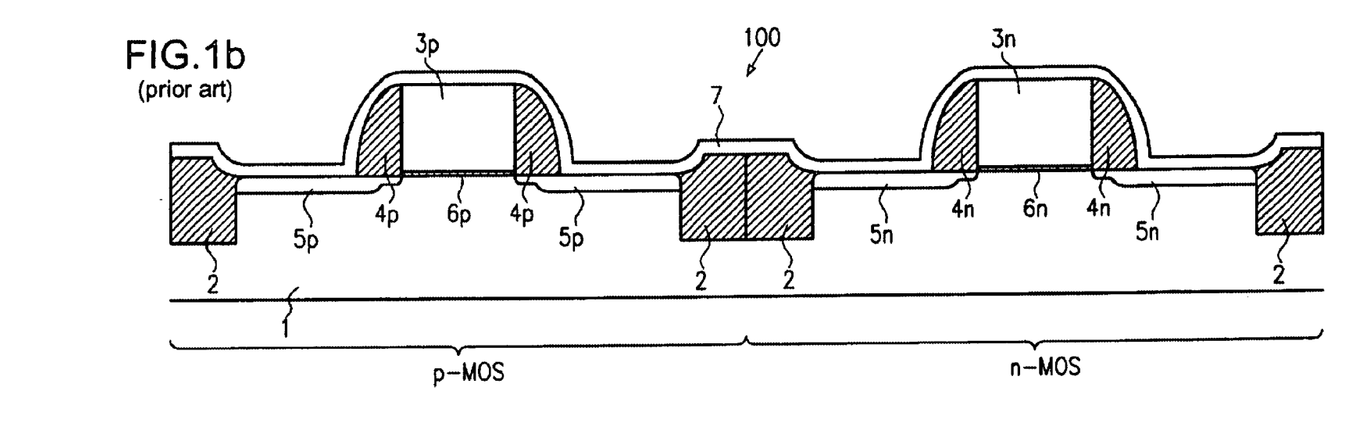

Subsequently, in a next step, a metal layer 7 is deposited on the CMOS region 100, as depicted in FIG. 1b. Usually, either titanium (Ti) or cobalt (Co) is used as a metal for forming the metal layer 7, and, typically, a physical vapor deposition (PVD) sputtering process is carried out for depositing the metal layer 7.

Figure 1C:
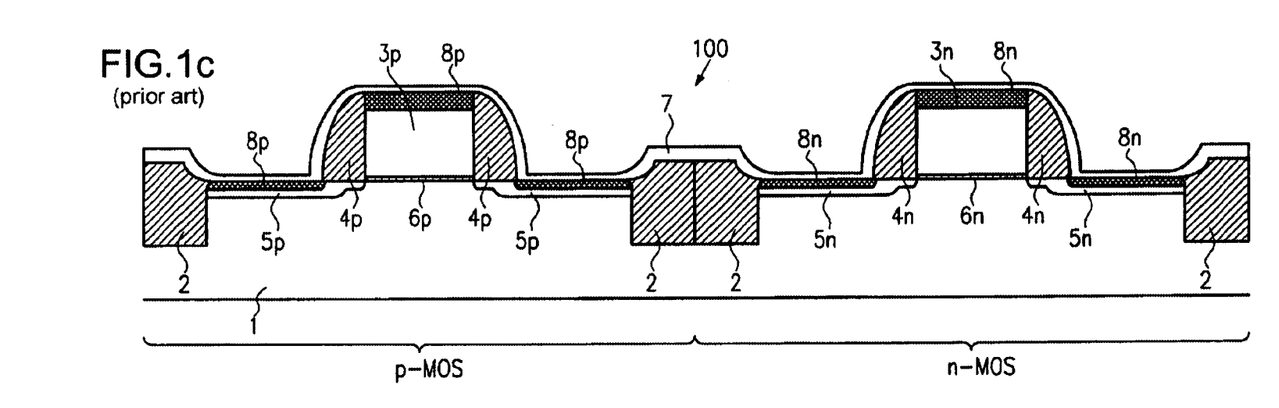

Once the metal layer 7 has been deposited, a low temperature thermal step (approximately 450° C. or 650° C. for cobalt and titanium, respectively) is carried out to react the metal in contact with silicon (Si) on the source/drain regions 5p and 5n and the polysilicon gate electrodes 3p and 3n. During the thermal step, inter-diffusion of the polysilicon and metal occurs, on the upper surface 10p, 10n of the polysilicon gate electrode 3p and 3n as well as on the source/drain regions 5p and 5n not covered by oxide. As a result, metal silicides 8p and 8n are formed, as depicted in FIG. 1c, whereby the metal is at least partially consumed.

Figure 1D:
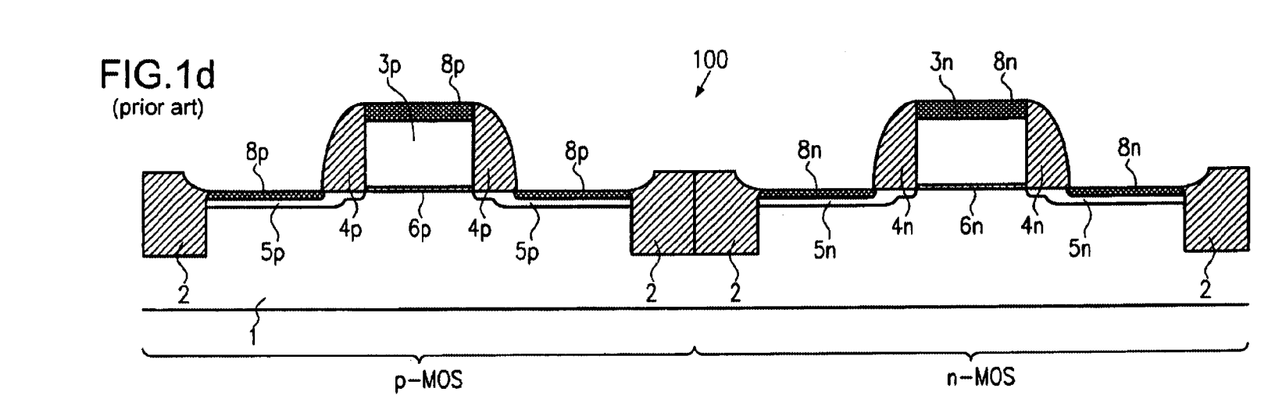

In a subsequent step, as depicted in FIG. 1d, the unreacted metal is selectively removed with a selective wet-etch step, leaving behind the metal silicide layers 8p and 8n on top of the polysilicon gate electrodes 3p and 3n and on the source and drain regions 5p and 5n.

Commonly, a further heat treatment is carried out at a higher temperature than the previous heat treatment to transform the metal silicide 8p, 8n into a more stable phase that exhibits a lower resistance than the metal silicide formed during the previous low temperature heat treatment. For example, if cobalt is used in the first heat treatment, a cobalt monosilicide is formed, which is then converted into a cobalt disilicide.

Since the finally-obtained metal silicide layers 8p and 8n exhibit a sheet resistance which is much lower compared to the sheet resistance of polysilicon, the total resistance of the gate electrodes 3p, 3n including the metal silicide layers 8p, 8n is decreased.

The prior art method described above has accomplished satisfactory results for devices having minimum feature sizes of $0.5\mu$ and more. The above method, however, is not completely adequate to compensate for the increase of the polysilicon sheet resistance which arises in cases of deep-sub-micron devices, i.e., with feature sizes smaller or equal to $0.25\mu$. The reason for this can be explained as follows. As a general rule, decreasing the transistor size, i.e., the channel length, in FIG. 1 the horizontal distance between the drain/source regions 5p or between the drain/source region 5n, requires reducing the thickness of the gate insulation layer 6p, 6n and necessitates shallower source/drain regions, which in turn restricts the achievable thickness of the metal silicides 8p, 8n. As the metal silicides 8p, 8n for the gate electrodes 3p, 3n are simultaneously formed with the metal silicides of the drain and source regions, the thickness, and thus the reduction in resistance, of the gate silicide is also restricted.

As the cross-sectional dimensions of the polysilicon gate electrodes decrease as a result of the continuous miniaturization of the devices, the sheet resistance of the polysilicon portions of the gate structures inversely increases and becomes predominant with respect to the low resistance of the silicide layers. The final, total resistance of the gate electrodes is therefore only scarcely influenced by the silicide layer but practically corresponds to the resistance of the polysilicon portion of the gate structure.

Since the trend toward ever decreasing miniaturization of the devices manufacturable on a substrate will continue in years to come, it clearly results that the formation of metal silicide layers on the top of gate polysilicon lines according to the prior art methods will render it very difficult to realize gate structures featuring resistances in conformity with the electrical performances required.

Accordingly, in view of the above explained problems, it would be desirable to improve the resistance of polysilicon lines eliminating or at least partially limiting the drawbacks of the prior art.

SUMMARY OF THE INVENTION

In general, the present invention is directed to devices and a method allowing the resistance of polysilicon layers to be significantly reduced by forming an increased silicide region in conductive silicon-containing lines. Moreover, the present invention allows the realization of recessed spacers for the manufacturing of field effect transistors, wherein the side spacers cover only the lower portions of the sidewalls of the gate polysilicon lines.

Additionally, silicide layers may be formed on polysilicon lines of a significantly increased thickness compared to the metal silicide layers formed on the source and drain areas, wherein the PN-junction integrity of the source/drain areas is not compromised.

For this purpose, according to one embodiment, the present invention relates to a method of decreasing the resistance of a conductive silicon-containing feature, wherein the method comprises forming a conductive silicon-containing feature, the feature having sidewalls and an upper surface and forming spacer elements adjacent a portion of the sidewalls, the spacers covering less than all of the sidewalls and defining an exposed portion of the sidewalls. Moreover, the method comprises forming a metal layer on at least the upper surface and exposed portion of the sidewalls, and forming a metal silicide on the upper surface and the exposed portion of the sidewalls by performing at least one thermal treatment.

According to another embodiment, the invention relates to a method of forming the gate electrode of at least one field effect transistor to be formed on a substrate. The method comprises forming at least one line of polysilicon on an active region of the at least one transistor and forming dielectric sidewall spacers on the lower portion of the sidewalls of the at least one polysilicon line by depositing a layer of a dielectric material on the upper surface and the sidewalls of the at least one polysilicon line and etching the dielectric material to expose the upper surface and a portion of the at least one polysilicon line. Furthermore, the method comprises forming a metal layer on the upper surface and the exposed portions of the sidewalls of the at least one polysilicon line, and reacting, at least partially, the polysilicon and the metal at the polysilicon metal interface into metal silicide by a thermal treatment.

In still another embodiment of the present invention, there is provided a field-effect transistor comprising at least one silicon-containing gate electrode. The field effect transistor further comprises a metal silicide layer covering the upper surface and the upper portions of the sidewalls of the at least one silicon-containing gate electrode, wherein the upper portion covers at least 10–50% of the total sidewall area of the silicon-containing gate electrode.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is understood to be of particular advantage when used for forming the metal silicides of CMOS transistors. For this reason, examples will be given in the following in which corresponding embodiments of the present invention are utilized for forming the metal silicides of a CMOS transistor. However, it has to be noted that the present invention is not limited to the formation of metal silicides of CMOS transistors but can be used in any other situation in which the realization of metal silicide layers is required. For example, an integrated circuit may comprise one or more silicon lines connecting two or more semiconductor elements. The present invention is also applicable to these silicon lines, and the gate electrodes described above and in the following illustrative embodiments are to represent any silicon line, irrespective of the crystalline structure and the degree and type of dotation. Moreover, although described with reference to a CMOS transistor pair, the present invention also relates to single NMOS transistors, PMOS transistors and field effect transistors having a gate insulation layer other than an oxide layer.

In FIGS. 2a–2g and 3a–3b, the features already described with reference to FIGS. 1a–1d are identified by the same reference numerals. In particular, in FIGS. 2a–2g and 3a–3b, reference 1 relates to an arbitrary section of a substrate, for instance a silicon wafer, on which a CMOS transistor 100 is to be formed. Reference 2 relates to isolation structures which have been previously formed according to processes well known to those skilled in the art. The isolation structure 2 divides the section of the substrate 1 in two portions, namely a PMOS portion and an NMOS portion on which the PMOS transistor and the NMOS transistor have to be formed, respectively. In the specific case depicted in FIGS. 2a–2g and 3a–3b, the PMOS portion is depicted on the left side of the figures while the NMOS portion is depicted on the right side. Moreover, it is assumed that the isolation structures 2 are provided as Shallow-Trench-Isolation (STI) structures. However, other isolation structures, for instance LOCOS structures (local oxidation of silicon) could have been formed instead of STI structures. Regardless of the method used, the isolation structures 2 essentially comprise an isolating material such as silicon oxide or the like. In FIGS. 2a–2g and FIG. 3a–3b, references 3p and 3n relate to the polysilicon gate electrodes, which will also be referred to as gate polysilicon lines formed on the PMOS portion and the NMOS portion, respectively. References 6p and 6n relate to the gate insulation layers formed on the PMOS portion and the NMOS portion. Additionally, references 5'p and 5'n relate to so-called source/drain extensions (SDE). These source/drain extensions are also called lightly doped areas of the source and drain and are normally formed by ion implantation steps. References 4'p and 4'n relate to sidewall spacers formed on the PMOS and NMOS region, respectively. The way these sidewall spacers 4'p and 4'n are formed is one aspect of the present invention that will be described further herein. References 5p and 5n relate to the source and drain areas of the PMOS and the NMOS transistors, respectively. Finally, references 8'p and 8'n relate to metal silicide layers as formed according to illustrative embodiments of the present invention described in the following.

Figure 2A:
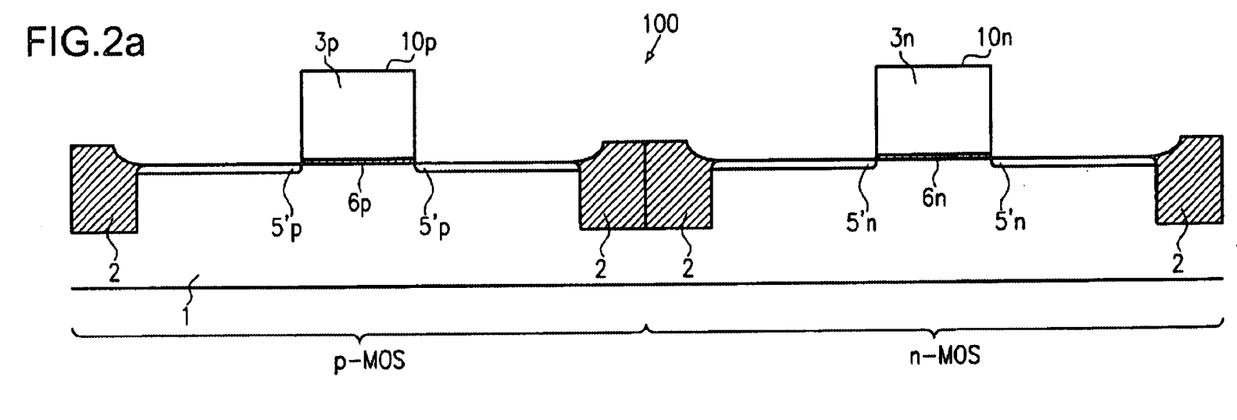
FIGS. 2a–2g represent a process sequence of a method of forming metal silicides according to a first embodiment of the present invention.
Figure 2B:
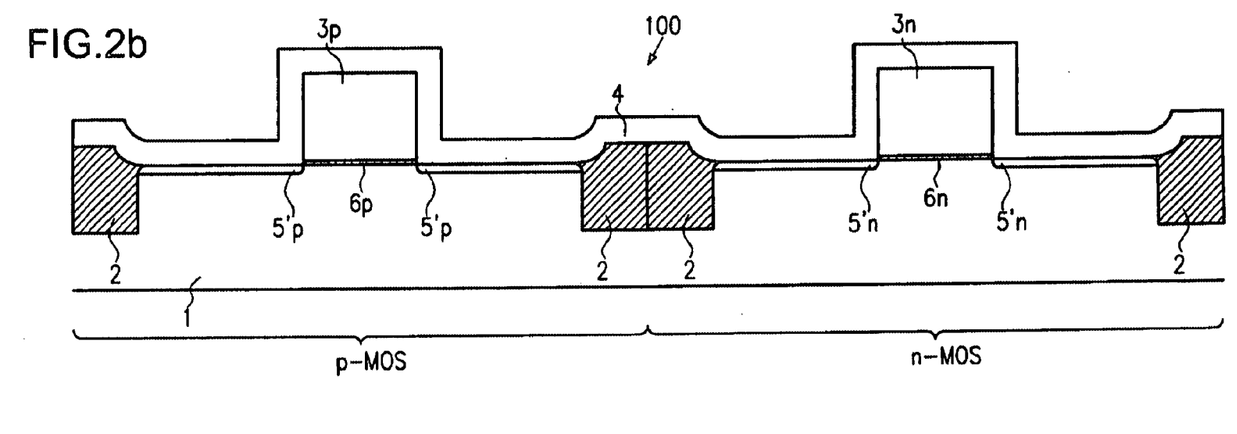

In FIG. 2a, the gate insulation layers 6b and 6n, as well as the polysilicon gate electrodes 3p and 3n, have already been formed. In a first step according to one embodiment of the present invention, as depicted in FIG. 2b, a layer 4 of a dielectric material is formed on the substrate. For example, a layer of silicon nitride can be deposited according to a low pressure chemical vapor deposition (LPCVD) technique. As is apparent from FIG. 2b, the layer 4 is of a substantially uniform thickness all over the substrate 1.

Figure 2C:
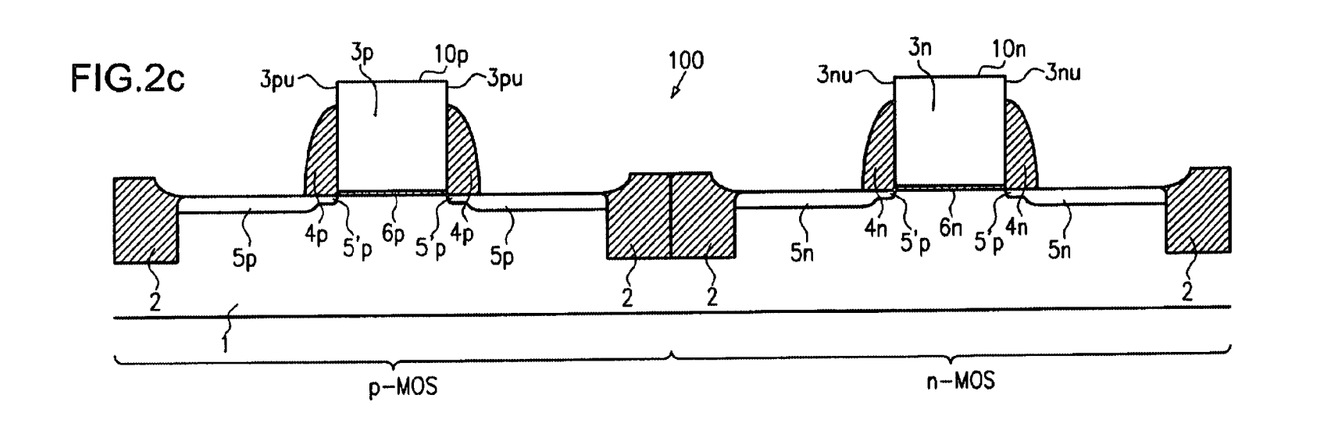

Subsequently, in a next step, the dielectric layer 4 is anisotropically etched back, as depicted in FIG. 2c. To this end, a dry-etching process, for instance, can be carried out. The goal of the etching step is the formation of the dielectric sidewall spacers 4'p and 4'n depicted in FIG. 2c, namely dielectric sidewall spacers which do not cover the sidewalls of the polysilicon gate electrodes 3p and 3n completely, but leave the upper portions 3pu, 3nu of the walls of the polysilicon gate electrodes 3p and 3n uncovered. To this end, the anisotropic etching process is not stopped once the dielectric material is removed from the source and drain regions and the upper surface of the polysilicon gate electrodes 3p and 3n, but is continued so as to overetch the dielectric layer 4 until portions of the dielectric layer 4 on the sidewalls of the polysilicon gate electrodes 3p and 3n are removed and the upper portions of the sidewalls of the polysilicon gate electrodes 3p and 3n are exposed. Since the etching rate of the etching process is known in advance, exposing the upper portions 3pu, 3nu of the sidewalls of the polysilicon gate electrodes 3p and 3n can be obtained by opportunely selecting the overall duration of the etching process.

The formation of the dielectric sidewall spacers 4'p and 4'n, as depicted in FIG. 2c, is different from the prior art methods of forming sidewall spacers described in the introductory part, wherein no controlled overetching is performed so that the sidewalls are substantially completely covered by the sidewall spacers.

According to the embodiment described above, the dielectric sidewall spacers 4'p and 4'n are obtained by anisotropically overetching a dielectric layer of a substantially uniform thickness. However, as will be apparent from the disclosure of a further embodiment of the present invention given below, dielectric sidewall spacers as depicted in FIG. 2 can also be obtained by depositing a dielectric layer of a non-uniform thickness and etching the dielectric layer, for instance during a wet-etching step.

In one embodiment, in overetching the dielectric layer 4, the gate insulation layers 6p and 6n extending beyond the polysilicon gate electrodes 3p, 3n below the dielectric layer 4 may also be removed, especially when the dielectric layer is comprised of silicon dioxide. Once the dielectric sidewall spacers 4'p and 4'n have been formed, the manufacturing process advances with the formation of the heavily doped, deeper parts of the source and drain regions by ion implantation, wherein the dielectric sidewall spacers 4'p, 4'n serve as implantation masks in the respective implantation step. In FIG. 2c, the resulting source and drain regions are identified by the references 5p and 5n.

Figure 2D:
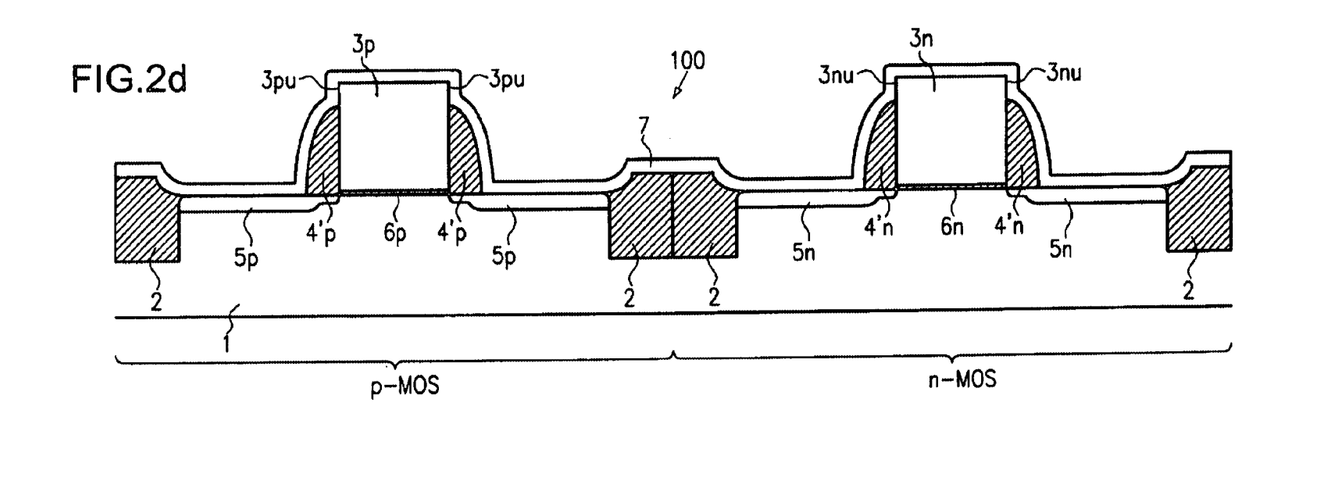

In a next step, as depicted in FIG. 2d, a metal layer 7 is deposited on the substrate 1. For instance, titanium, cobalt or any other refractory metal such as tantalum, tungsten, zirconium, nickel or a combination thereof can be selected as a metal for forming the metal layer 7. Due to the fact that the dielectric sidewall spacers 4'p and 4'n do not cover the sidewalls of the polysilicon gate electrodes 3p and 3n completely, but the upper portions 3pu, 3nu of the sidewalls of the polysilicon gate electrodes 3p and 3n have been exposed during the previous anisotropic overetching step, portions of the metal layer 7 come into contact with the exposed upper portions 3pu and 3nu of the sidewalls of the polysilicon gate electrodes 3p and 3n. Accordingly, a metal-silicon interface is formed not only on the upper surface 10p, 10n of the polysilicon gate electrodes 3p and 3n and the source and drain regions 5p and 5n, as in the prior art methods, but a metal-silicon interface is also formed at the upper portions 3pu and 3nu of the sidewalls of the polysilicon gate electrodes 3p and 3n.

Figure 2E:
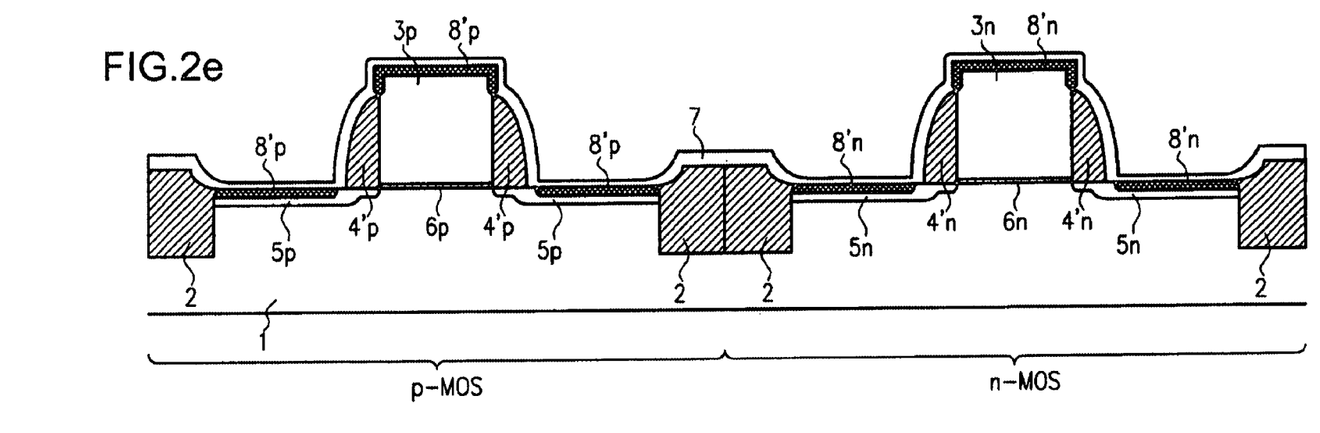

Subsequently, in a next step, a thermal treatment (about 650° C. for titanium, however, other temperatures may be selected depending on the metal used) is carried out to react the metal and the silicon exposed on the source and drain regions 5p and 5n and the polysilicon gate electrodes 3p and 3n. As a result, vertical diffusion of the polysilicon and silicide-forming metal occurs, at the upper surface 10p, 10n of the polysilicon gate electrodes 3p and 3n and the source and drain regions 5p and 5n, along with horizontal diffusion at the metal-polysilicon interface in correspondence of the upper portions 3pu, 3nu of the sidewalls of the polysilicon gate electrodes 3p and 3n. The thermal treatment results therefore in the formation of metal silicon compound layers 8'p and 8'n on the polysilicon gate electrodes 3p and 3n and the source and drain regions 5p and 5n, as depicted in FIG. 2e. The thickness of the layers 8'p, 8'n depends on the type of metal, the initial layer thickness of the metal layer 7 and on the process parameters of the heat treatment. In one embodiment, the metal layer 7 may receive a cap layer, for example formed of titanium or titanium nitride, (not shown) to more reliably control the chemical reaction between the metal and the underlying silicon, whereby the cap layer reduces any deleterious effects of an ambient during the heat treatment, such as the reaction of residual oxygen with the metal silicon compound.

The process is then continued with the removal of the unreacted metal (and possibly the cap layer) with an etching step, leaving behind the metal silicon compound layers 8'p and 8'n on the polysilicon gate electrodes 3p and 3n and the source and drain regions 5p and 5n. For instance, a wet-etching step can be carried out in which a bath of $H_2O:H_2O_2:NH_4OH$ is used that removes substantially only the unreacted metal.

Figure 2F:
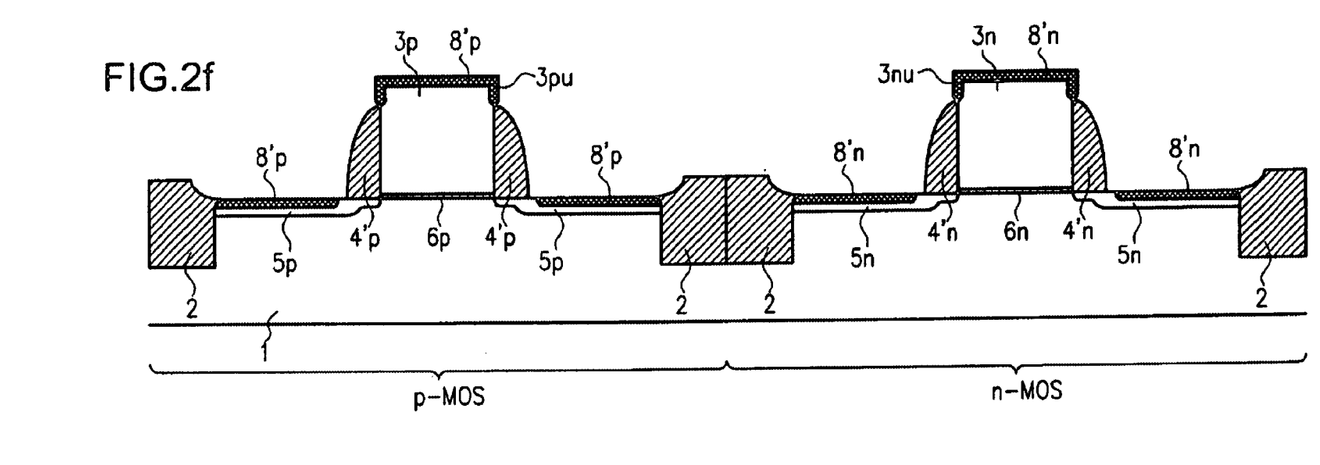

In FIG. 2f, the substrate 1 is depicted at the end of the etching process. In particular, as is apparent from FIG. 2f, the metal silicon compound layers 8'p and 8'n on the gate polysilicon lines 3p and 3n do not cover only the upper surface 10p, 10n of the polysilicon gate electrodes 3p and 3n but extend to cover the upper portions of the sidewalls of the polysilicon gate electrodes 3p and 3n not covered by the dielectric sidewall spacers 4'p, 4n'. In one embodiment, the sidewall portions 3pu, 3nu may occupy approximately 10–50% of the sidewall area of the polysilicon lines 3p, 3n. The size of the portions 3pu, 3nu may be controlled by controlling the degree of "overetching."

Subsequently, a further heat treatment is preformed to convert the metal silicon compound 8'p, 8'n into a more stable low resistance metal silicide. For the sake of convenience, the same reference signs 8'p, 8'n are used to indicate the metal silicon compound and the metal silicide. The temperature and the duration of the further heat treatment may be selected to convert the metal silicon compound substantially completely into the metal silicide.

Accordingly, metal silicide layers 8'p and 8'n have been formed, which have a total extension significantly larger compared to the metal silicide layer 8p, 8n obtained according to the prior art methods as depicted in FIG. 1d. In other words, a significantly larger portion of the polysilicon gate volume has been converted into silicide compared to the prior art methods, thus resulting in a significantly reduced gate resistance.

Figure 2G:
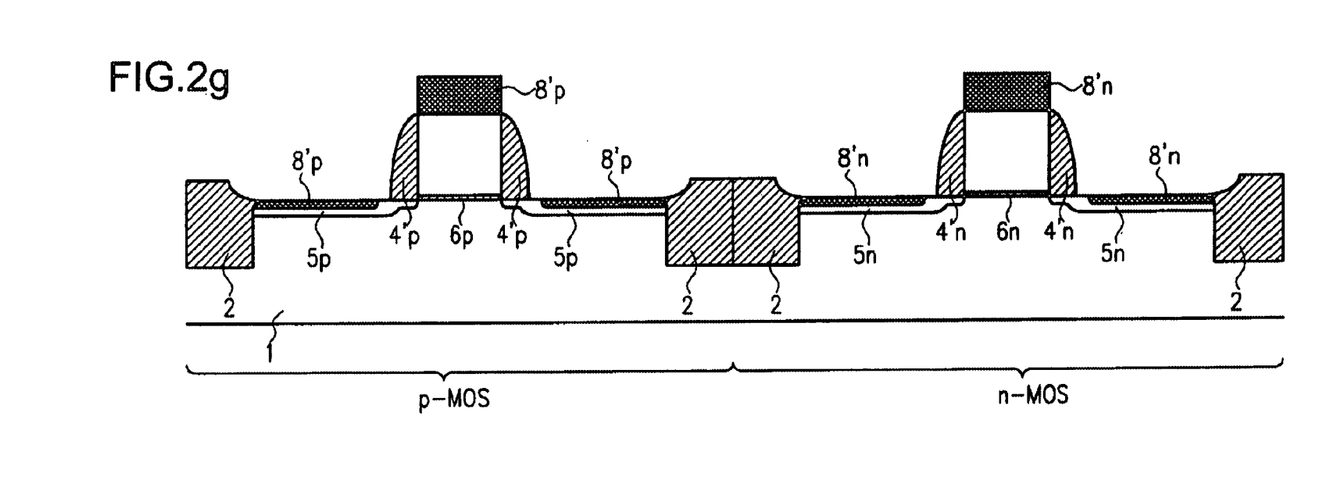

A further advantage of the embodiments of the present invention described above is that, for aggressively scaled devices, namely for devices featuring deep sub-micron gate length, the silicide layers 8'p and 8'n on the sidewalls of the polysilicon gate electrodes 3p and 3n can even merge, as depicted in FIG. 2g, forming a homogeneous silicide layer on the corresponding polysilicon line of a significantly increased thickness compared to the metal silicide layers on the source and drain regions. In this case, the total resistance of the gate structure is even more decreased.

Figure 3A:
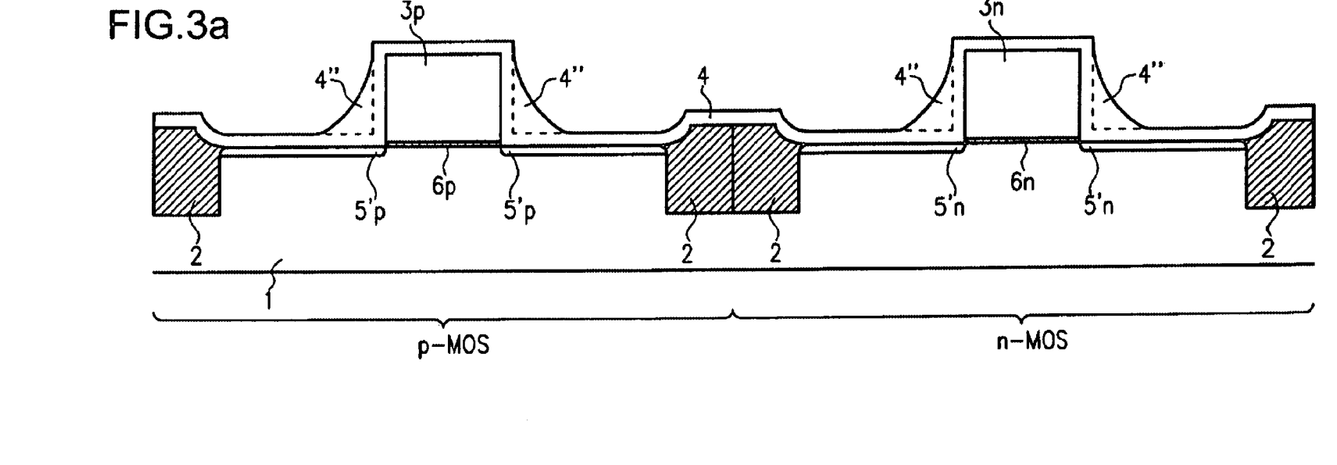
FIGS. 3a–3b represent an example of the way the process sequence depicted in FIGS. 2a–2g can be modified according to another embodiment of the present invention.

Some of the steps of the sequence described above may be modified according to further illustrative embodiments. In the following, description will be given with reference to FIGS. 3a and 3b of the steps differing from the previously described embodiments. Starting from the CMOS device 100 shown in FIG. 2a, the dielectric layer 4 is formed. As depicted in FIG. 3a, the dielectric layer 4 does not have a substantially uniform thickness, but is deposited in such a way that smooth edges are obtained in correspondence to the sidewalls of the polysilicon gate electrodes 3p and 3n so that additional portions 4" of dielectric material are accumulated in conformity with the sidewalls of the polysilicon gate electrodes 3p and 3n compared to the case previously described and depicted with broken lines where a dielectric layer of a substantial uniform thickness is deposited. For instance, the deposition parameters during a chemical vapor deposition (CVD) process may be selected so as to intentionally obtain a deposition profile that is "smeared out," similar to the structure shown in FIG. 3a.

Figure 3B:
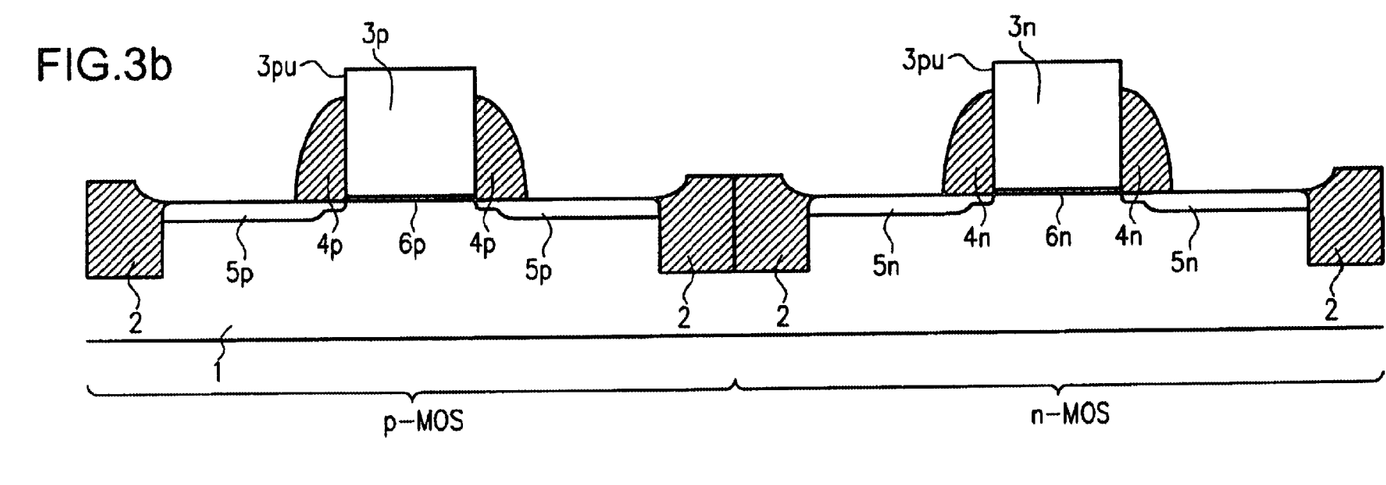

FIG. 3b shows the CMOS structure 100, once the dielectric layer 4 has been deposited, the sequence is continued with an etching step for forming dielectric sidewall spacers 4'p and 4'n of the type depicted in FIGS. 2a–2g. In the present case, however, in view of the fact that portions 4" of dielectric material are accumulated in correspondence to the sidewalls of the polysilicon gate electrodes 3p and 3n, no anisotropic overetching steps are required but a usual isotropic wet-etching step can be carried out. In particular, the isotropic etching step is interrupted once the horizontal portions of the dielectric layer 4 are removed (i.e., the dielectric material on the source and drain regions and the upper surface of the polysilicon lines), so that dielectric portions are left in correspondence of the lower portions of the sidewalls of the polysilicon gate electrodes 3p and 3n, with the upper portions 3pu, 3nu of the sidewalls of the polysilicon gate electrodes 3p and 3n being exposed. As a result, dielectric sidewall spacers 4'p and 4'n similar to those realized according to the embodiment depicted in FIG. 2 are obtained.

Once the dielectric sidewall spacers 4'p and 4'n have been formed, the sequence is continued, as in the case of the embodiments described with reference to FIGS. 2a–2e, and continues until metal silicide layers 8'p and 8'n, as depicted in FIGS. 2f–2g, are realized.

The latter embodiment may be preferred to the former embodiments in cases where wet-etching is considered to be more convenient than dry-etching.

In conclusion, the present invention allows realizing recessed sidewall spacers, namely sidewall spacers covering only the lower portion of the sidewalls of the polysilicon gate electrodes. It is to be noted that the polysilicon gate electrodes described so far may represent any silicon-containing conductive lines so that the recessed sidewall spacers may be formed at any silicon lines.

Furthermore, the method of the present invention allows relatively larger portions of the polysilicon gate electrodes and/or silicon lines to be converted into a silicide as compared to the prior art methods, resulting in a significantly reduced line resistance, especially when extremely narrow lines of sophisticated semiconductor devices are considered.

Finally, the process according to the present invention may readily be implemented in existing process flows without adding costs and/or complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a conductive silicon-containing feature, said feature having sidewalls and an upper surface;
   forming spacer elements adjacent to a portion of said sidewalls, said spacer elements covering less than all of said sidewalls and defining an exposed portion of said sidewalls by depositing a layer of a dielectric material on the upper surface and upper and lower sidewall portions of the conductive silicon-containing feature, with the layer of dielectric material being thicker at the lower sidewall portions of the conductive silicon-containing feature than on the upper surface portion of the conductive silicon-containing feature and isotropically etching the dielectric material by performing a single isotropic etching process until the upper sidewall portion is exposed;
   forming a metal layer on at least the upper surface and exposed portion of the sidewalls; and
   forming a metal silicide on said upper surface and said exposed portion of said sidewalls by performing at least one thermal treatment.

2. A method as claimed in claim 1, wherein depositing a layer of a dielectric material comprises depositing one of silicon dioxide and silicon nitride with a predefined thickness.

3. A method as claimed in claim 2, wherein converting silicon into metal silicide results in the formation of a layer of metal silicide on the upper surface and the upper sidewall portions of the conductive silicon-containing feature.

4. A method as claimed in claim 3, wherein at least one of the width of the conductive silicon-containing feature and the thermal conditions is selected such that, after formation of the metal silicide, the portions of the metal silicide layers on the exposed sidewall portions of the conductive silicon-containing feature merge so that a layer of metal silicide of a substantially uniform thickness is formed on the upper surface of the conductive silicon-containing feature.

5. A method as claimed in claim 4, wherein the metal layer comprises at least one of titanium, cobalt, tantalum, zirconium, tungsten, nickel and a combination thereof.

6. A method as claimed in claim 5, further comprising controlling at least one of a thickness of the dielectric layer and an etch time to adjust a size of a surface area of the upper sidewall portion.

7. A method as claimed in claim 4, wherein heat treating the semiconductor device includes annealing the semiconductor device at a first average temperature for a first time interval to create a metal silicon compound, and annealing the semiconductor device at a second average temperature for a second time interval to create a metal silicide, wherein the first average temperature is lower than the second average temperature.

8. A method as claimed in claim 7, further comprising removing unreacted metal after annealing at the first average temperature by selective wet-etching.

9. The method of claim 1, wherein at least one deposition parameter is controlled to adjust the thickness of the lower sidewall portion.

10. The method of claim 1, wherein a surface area of the upper sidewall portion is in the range of approximately 10–50% of the total sidewall surface of the at least one conductive silicon-containing feature.

11. A method of claim 1, wherein the conductive silicon-containing feature comprises at least one of a gate electrode and a polysilicon line.

12. A method as claimed in claim 11, wherein at least one of the width of the conductive silicon-containing feature or the thermal conditions is selected such that, after formation of the metal silicide, the portions of the metal silicide layer on the upper sidewall portions of the conductive silicon-containing feature merge so that a layer of metal silicide of a substantially uniform thickness is formed on the upper surface of the conductive silicon-containing feature.

13. A method as claimed in claim 1, further comprising forming a gate insulation layer prior to depositing the dielectric layer and removing excess material of the gate insulation layer while etching the dielectric layer.

14. A method as claimed in claim 1, wherein forming the metal layer includes forming a cap layer as a top layer exposed to an ambient during heat treating the semiconductor device.

15. A method of forming the gate electrode of at least one field effect transistor to be formed on a substrate, the method comprising:
   forming at least one line of polysilicon on an active region of the at least one transistor;
   forming dielectric sidewall spacers on the lower portion of the sidewalls of the at least one polysilicon line by depositing a layer of a dielectric material on the upper surface and the upper and lower sidewall portions of the at least one polysilicon line, with the layer of dielectric material being thicker at the lower sidewall portions of the at least one polysilicon line than on the upper surface portion of the polysilicon line;
   performing a single isotropic etching process to isotropically etch the dielectric material to expose the upper surface and the upper sidewall portions of the at least one polysilicon line;
   forming a metal layer on the upper surface and the exposed upper portions of the sidewalls of the at least one polysilicon line; and
   reacting at least partially the polysilicon and the metal at the polysilicon metal interface into metal silicide by a thermal treatment.

16. A method as claimed in claim 15, wherein depositing a layer of a dielectric material comprises depositing one of silicon dioxide and silicon nitride with a predefined thickness.

17. A method as claimed in claim 15, wherein at least one of the width of the polysilicon line and the thermal conditions is selected such that, after formation of the metal silicide, the portions of the metal silicide layers on the upper sidewall portions of the polysilicon line merge so that a layer of metal silicide of a substantially uniform thickness is formed on the upper surface portion of the polysilicon line.

18. A method as claimed in claim 15, wherein the metal layer comprises at least one of titanium, cobalt, tantalum, zirconium, tungsten, nickel and a combination thereof.

19. A method as claimed in claim 15, further comprising controlling at least one of a thickness of the dielectric layer and an etch time to adjust a size of a surface area of the upper side wall portion.

20. A method as claimed in claim 15, wherein heat treating the semiconductor device includes annealing the semiconductor device at a first average temperature for a first time interval to create a metal silicon compound, and annealing the semiconductor device at a second average temperature for a second time interval to create the metal silicide, wherein the first average temperature is lower than the second average temperature.

21. A method as claimed in claim 20, further comprising removing unreacted metal after annealing at the first average temperature by selective wet-etching.

22. The method of claim 15, wherein a surface area of the exposed sidewall portion is in the range of approximately 10–50% of the total sidewall surface of the at least one polysilicon line.

23. A method as claimed in claim 15, further comprising forming a gate insulation layer prior to forming the dielectric layer and removing excess material of the gate insulation layer while etching the dielectric layer.

24. A method as claimed in claim 15, wherein forming the metal layer includes forming a cap layer as a top layer exposed to an ambient during heat treating the substrate.

* * * * *